(12) United States Patent
Hayashi

(10) Patent No.: US 7,675,632 B2
(45) Date of Patent: Mar. 9, 2010

(54) EXPOSURE APPARATUS AND DEVICE MANUFACTURING METHOD

(75) Inventor: Nozomu Hayashi, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 127 days.

(21) Appl. No.: 11/950,031

(22) Filed: Dec. 4, 2007

(65) Prior Publication Data

US 2008/0130017 A1 Jun. 5, 2008

(30) Foreign Application Priority Data

Dec. 5, 2006 (JP) ............................. 2006-328841

(51) Int. Cl.
*G01B 11/14* (2006.01)
(52) U.S. Cl. ..................................... 356/620
(58) Field of Classification Search ................. 356/614, 356/615, 620
See application file for complete search history.

(56) References Cited

U.S. PATENT DOCUMENTS

| | | | | |
|---|---|---|---|---|
| 5,654,553 A | * | 8/1997 | Kawakubo et al. ......... | 250/548 |
| 5,680,200 A | * | 10/1997 | Sugaya et al. .............. | 355/53 |
| 6,057,908 A | * | 5/2000 | Ota ........................... | 355/55 |
| RE37,359 E | * | 9/2001 | Wakamoto et al. .......... | 250/548 |
| 6,744,512 B2 | * | 6/2004 | Takahashi ................. | 356/401 |
| 7,106,444 B2 | * | 9/2006 | Nakajima ................. | 356/401 |

FOREIGN PATENT DOCUMENTS

| JP | 2005-294474 | 10/2005 |
|---|---|---|
| KR | 10-2005-0048054 A | 5/2005 |

\* cited by examiner

*Primary Examiner*—Roy Punnoose
(74) *Attorney, Agent, or Firm*—Rossi, Kimms & McDowell LLP

(57) ABSTRACT

An exposure apparatus for exposing shot areas on a substrate comprises a measuring device configured to measure a position of an alignment mark in each of the shot areas on the substrate, and a controller configured to generate sample shot sets from the shot areas on the substrate, to cause the measuring device to measure the position of the alignment mark in each of the sample shot sets under each of measurement conditions, to calculate a shot arrangement based on the measured positions with respect to each of combinations of the measurement conditions and the sample shot sets, to calculate a variation of the shot arrangements calculated with respect to the sample shot sets with respect to each of the measurement conditions, and to display the variation calculated with respect to each of the measurement conditions.

5 Claims, 16 Drawing Sheets

FIG. 5

|  | WAVELENGTH | NA |
|---|---|---|
| ILLUMINATION CONDITION 1 | $\lambda 1$ | na1 |
| ILLUMINATION CONDITION 2 | $\lambda 1$ | na2 |
| ILLUMINATION CONDITION 3 | $\lambda 2$ | na1 |
| ILLUMINATION CONDITION 4 | $\lambda 2$ | na2 |

FIG. 6

|  | ALGORITHM | PROCESS WINDOW |
|---|---|---|
| DETECTION CONDITION 1 | TEMPLATE MATCHING | WIND1 |
| DETECTION CONDITION 2 | TEMPLATE MATCHING | WIND2 |
| DETECTION CONDITION 3 | PHASE DETECTION | WIND1 |
| DETECTION CONDITION 4 | PHASE DETECTION | WIND2 |

SAMPLE SHOT SET 1

SAMPLE SHOT SET 2

SAMPLE SHOT SET 3

SAMPLE SHOT SET 4

EXPOSURE APPARATUS AND DEVICE MANUFACTURING METHOD

BACKGROUND OF THE INVENTION

1. Field of the Invention

The present invention relates to an exposure apparatus and device manufacturing method used to manufacture a device such as a semiconductor device.

2. Description of the Related Art

A method of sensing a mark and a method of calculating a shot arrangement on a substrate in a conventional semiconductor manufacturing exposure apparatus will be described with reference to FIG. 12 (Japanese Patent Laid-Open No. 2005-294474).

First, an illumination condition switching unit 4 selects an illumination condition suitable for observing an alignment mark. A stage driving unit 17 moves a stage to a position where it is possible to observe an alignment mark (to be referred to as a "mark" hereinafter) WM on a substrate W. An illumination unit 3 is turned on to illuminate the mark WM through an imaging optical system 5, beam splitter 7, reticle R, and projection optical system 1. FIG. 3A shows an example of the mark WM in which a plurality of patterns having the same shape are arranged. A light beam reflected by the mark area passes through the projection optical system 1 and reticle R and reaches the beam splitter 7. The beam splitter 7 reflects the light beam so that the image of the mark WM is formed on the imaging plane of an image sensing unit 8 through an imaging optical system 6. The image sensing unit 8 photoelectrically converts the mark image. The illumination unit 3, illumination condition switching unit 4, imaging optical systems 5 and 6, beam splitter 7, and image sensing unit 8 form a mark image sensing optical system 2.

Next, an A/D converter 9 converts the mark image into a two-dimensional digital signal sequence. The digital signal sequence converted by the A/D converter 9 is sent to a control unit (a controller) 10'. The control unit 10' includes a detection condition switching unit 12', calculation unit 13', and generation unit 14'. The generation unit 14' generates a plurality of sample shot sets each including at least two of a plurality of shot areas by using the converted digital signal sequence. A measuring device (not shown) measures the central position of the mark WM. Before the measurement, the detection condition switching unit 12' selects a detection condition suitable for mark measurement.

As shown in FIG. 4, N shot areas S1, S2, ..., Si, ..., SN exist on the substrate W. Each of the N shot areas has the mark WM. A sample shot set including, as sample shots, a plurality of appropriate shot areas indicated by, for example, hatching in FIG. 4 of the N shot areas on the substrate W is determined in advance. The measuring device measures the mark WM of each sample shot included in the set sample shot set. The calculation unit 13' calculates the shot arrangement on the substrate by executing a statistical process of the measurement results of the mark WM by a stage position detection unit 18 and the measuring device.

The shot arrangement calculation method is effective in calculating an accurate shot arrangement. Conventionally, however, the operator determines the illumination light wavelength corresponding to a stable mark shape in the substrate W or executes inspection by using an overlay inspection apparatus different from the exposure apparatus, thereby determining the measurement condition suitable for shot arrangement calculation.

SUMMARY OF THE INVENTION

It is an object of the present invention to, for example, automatically determine a measurement condition suitable for shot arrangement calculation.

According to the present invention, there is provided an exposure apparatus for exposing a plurality of shot areas on a substrate. The apparatus comprises a measuring device configured to measure a position of an alignment mark in each of the shot areas on the substrate, and a controller configured to generate a plurality of sample shot sets from the plurality of shot areas on the substrate, to cause the measuring device to measure the position of the alignment mark in each of the plurality of sample shot sets under each of a plurality of measurement conditions, to calculate a shot arrangement based on the measured positions with respect to each of combinations of the plurality of measurement conditions and the plurality of sample shot sets, to calculate a variation of the shot arrangements calculated with respect to the plurality of sample shot sets with respect to each of the plurality of measurement conditions, and to display the variation calculated with respect to each of the plurality of measurement conditions.

According to the present invention, there is provided a method of manufacturing a device. The method comprises exposing a substrate to radiant energy using the above-described exposure apparatus, developing the exposed substrate, and processing the developed substrate to manufacture the device.

Further features of the present invention will become apparent from the following description of exemplary embodiments (with reference to the attached drawings).

BRIEF DESCRIPTION OF THE DRAWINGS

FIG. 5 is a table showing examples of illumination conditions;

FIG. 6 is a table showing examples of detection conditions;

DESCRIPTION OF THE EMBODIMENTS

The embodiments of the present invention will be described below.

First Embodiment

Figure 1:
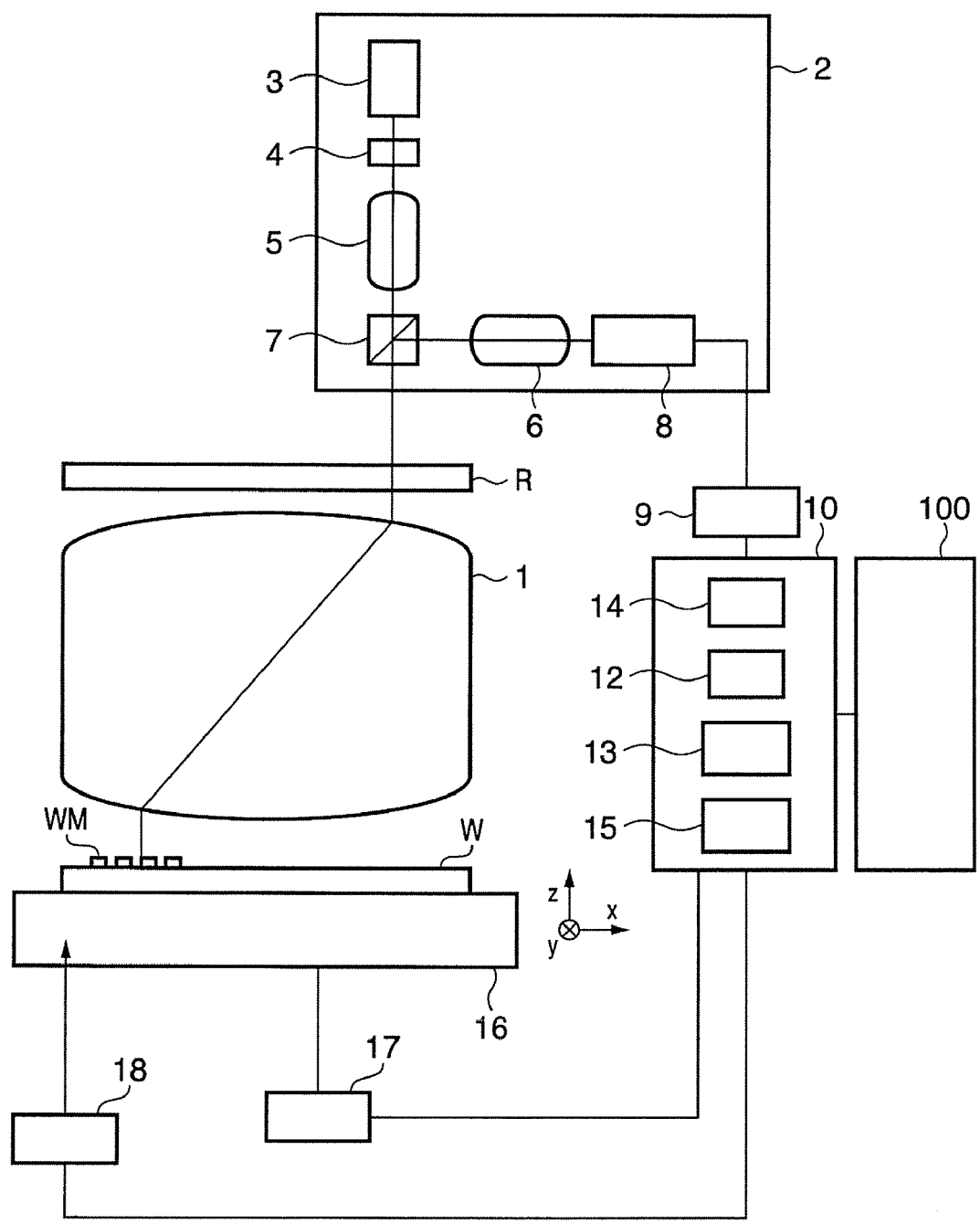
FIG. 1 is a view showing an arrangement example of an exposure apparatus according to the first and second embodiments.
Figure 12:
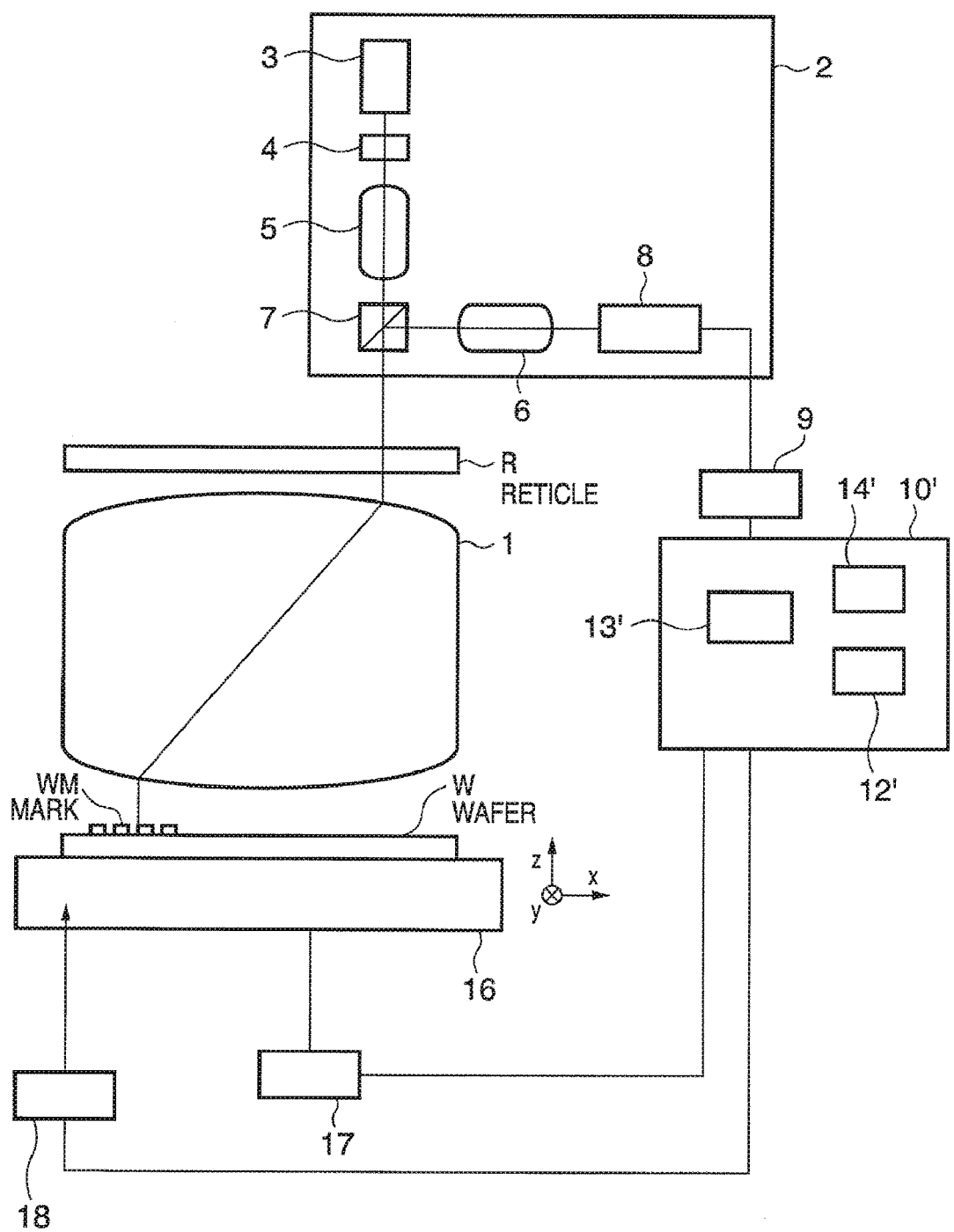
FIG. 12 is a view showing an arrangement example of a conventional exposure apparatus.

An exposure apparatus shown in FIG. 1 can have the same arrangement as the above-described exposure apparatus shown in FIG. 12 except a control unit (a controller) 10. The control unit 10 also includes a determination unit 15 in addition to the arrangement of the control unit 10'. An illumination condition switching unit 4 shown in FIG. 1 can select illumination conditions such as a wavelength, NA, and pupil shape, as shown in, for example, FIG. 5. A detection condition switching unit 12 can select detection conditions such as a plurality of measurement algorithms and process windows, as shown in, for example, FIG. 6. The illumination conditions and detection conditions constitute an alignment mark measurement condition.

A generation unit 14 generates a plurality of sample shot sets each including at least two of a plurality of shot areas. A measuring device including the mark image sensing optical system 2, the A/D converter 9, and a processor (not shown) that obtains a central position of the mark WM based on digital signals from the A/D converter 9 measures an alignment mark MW of each of the sample shot sets generated by the generation unit 14 under each of a plurality of measurement conditions. A calculation unit 13 derives a shot arrangement for each of combinations of the plurality of measurement conditions and the plurality of sample shot sets based on the measurement result. The determination unit 15 determines, as a measurement condition for an exposure process, one of the plurality of measurement conditions which has produced a minimum shot arrangement variation between the plurality of sample shot sets.

A method of determining a measurement condition optimum for calculating a shot arrangement on a substrate W will be described next.

Figure 2A:
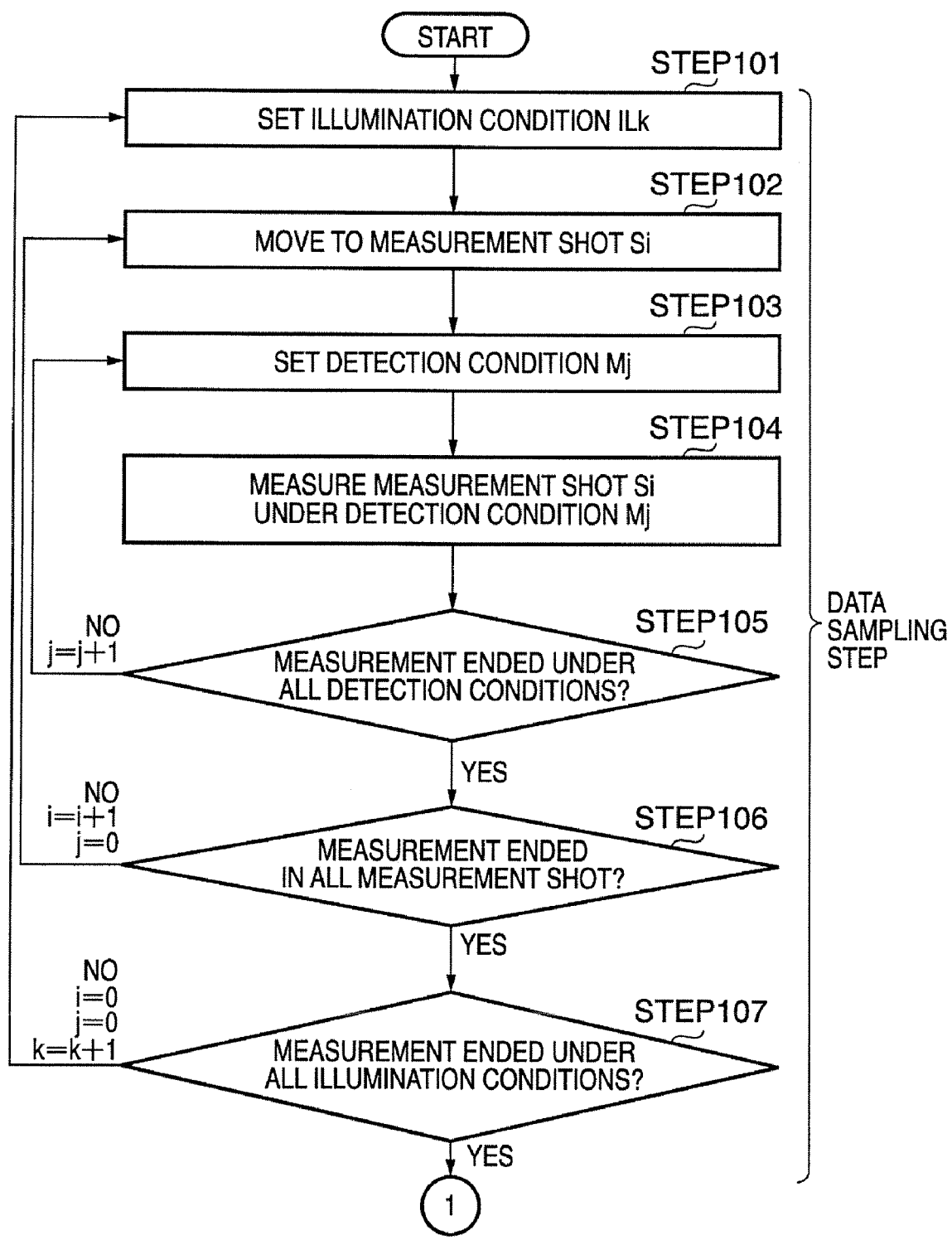
FIGS. 2A and 2B are flowcharts illustrating an example of a flow of measurement condition selection according to the first embodiment.
Figure 2B:
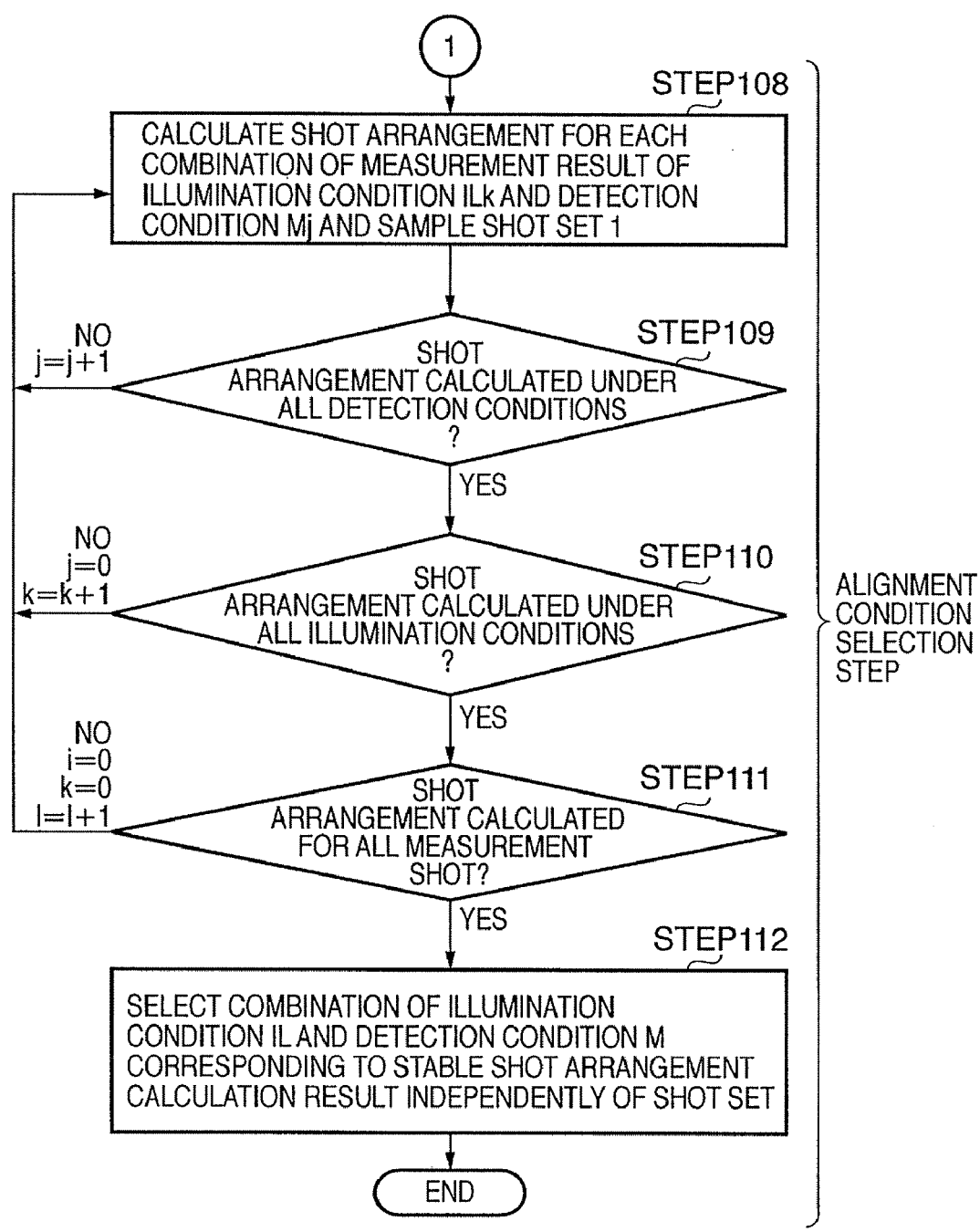

FIGS. 2A and 2B are flowcharts for explaining the sequence of measurement condition determination according to the first embodiment. In step 101, the illumination condition switching unit 4 selects a first illumination condition IL1. In step 102, a stage 16 moves to a position where it is possible to observe the mark WM in a first shot S1 on the substrate W. In step 103, the detection condition switching unit 12 selects a first detection condition M1.

Figure 3A:
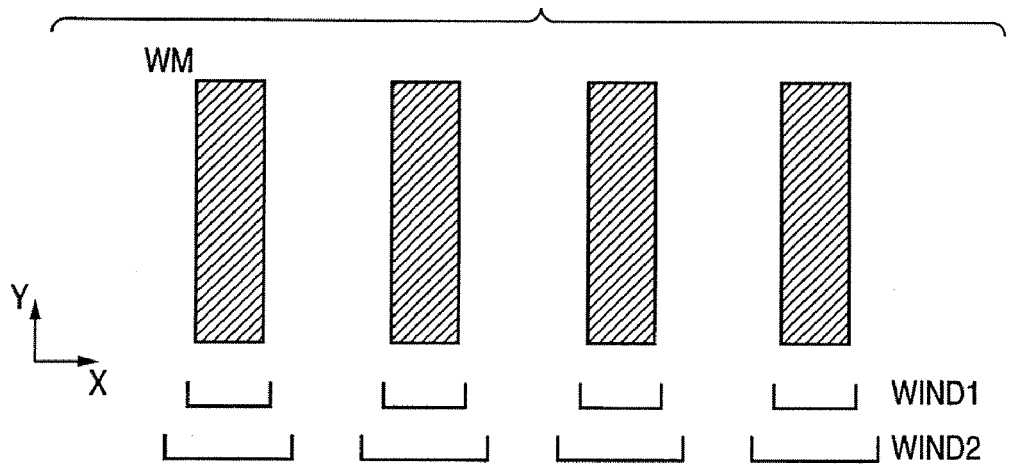
FIGS. 3A to 3C are views showing examples of a mark.

In step 104, the ith shot Si is measured under the jth detection condition Mj. More specifically, an illumination unit 3 is turned on to illuminate the mark WM. FIG. 3A shows an example of the mark in which a plurality of patterns having the same shape are arranged. A light beam reflected by the mark area forms the image of the mark WM on the imaging plane of an image sensing unit 8. The image sensing unit 8 photoelectrically converts the image of the mark WM. Next, an A/D converter 9 converts the mark image into a two-dimensional digital signal sequence. A measuring device measures the central position of the mark WM by using the converted digital signal sequence.

In step 105, it is determined whether measurement has finished under all detection conditions. If measurement has finished under all detection conditions ("YES" in step 105), the process advances to step 106. If measurement has not finished under all detection conditions ("NO" in step 105), j is incremented by one, and the process returns to step 103.

The process after returning to step 103 will be described. In this case, the detection condition switching unit 12 selects a second detection condition M2, and the process advances to step 104. Steps 103 and 104 are repeated until measurement of the first shot S1 finishes under all detection conditions. When measurement of the first shot S1 has finished under all detection conditions ("YES" in step 105), the process advances to step 106.

In step 106, it is determined whether measurement has finished in all measurement shots. If measurement has finished in all measurement shots ("YES" in step 106), the process advances to step 107. If measurement has not finished in all measurement shots ("NO" in step 106), i is incremented by one, j is set to 0, and the process returns to step 102.

The process after returning to step 102 will be described. In this case, the process moves to a second shot S2, and steps 103 to 105 are repeated. When measurement of all shots has finished in accordance with the same procedure ("YES" in step 106), the process advances to step 107.

In step 107, it is determined whether measurement has finished under all illumination conditions. If measurement has finished under all illumination conditions ("YES" in step 107), the process advances to step 108. If measurement has not finished under all illumination conditions ("NO" in step 107), k is incremented by one, i and j are set to 0, and the process returns to step 101.

The process after returning to step 101 will be described. In this case, the illumination condition switching unit 4 sets a second illumination condition IL2, and steps 103 to 107 are repeated.

Figure 7:
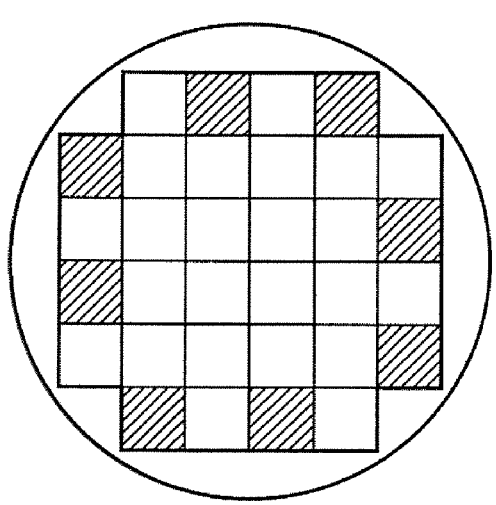
FIG. 7 is a view showing an example of a plurality of sample shot sets.
Figure 7:
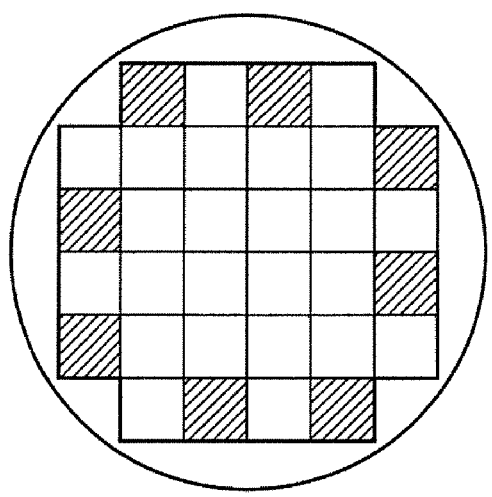
Figure 7:
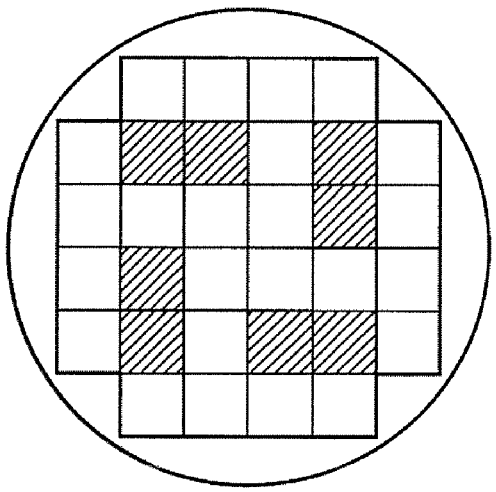
Figure 7:
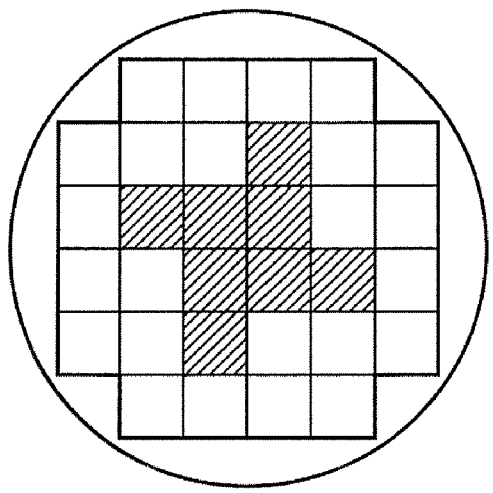

In step 108, after the data sampling step is ended under all illumination conditions and all detection conditions, shot arrangement calculation starts based on all combinations of illumination conditions ILk and detection conditions Mj sampled in the data sampling step and the sample shot sets shown in FIG. 7. The shot arrangement includes, for example, a shot magnification, shot rotation, shot orthogonality, and shot shift. In the initial state, j, k, and l are 0.

FIG. 7 is a view showing an example of sample shot sets in calculating the shot arrangement on the substrate W by a statistical process. The sample shot set indicates a set of a plurality of sample shots serving as a basis of shot arrangement calculation. As shown in FIG. 7, a sample shot set includes eight sample shots. However, any number of sample shots are usable when the statistical process of the shot arrangement is possible. The sample shot sets may share several shots.

In step 109, it is determined whether shot arrangements are calculated under all detection conditions. If shot arrangements are calculated under all detection conditions ("YES" in step 109), the process advances to step 110. If measurement has not finished under all detection conditions ("NO" in step 109), j is incremented by one, and the process returns to step 108.

In step 110, it is determined whether shot arrangements are calculated under all illumination conditions. If shot arrangements are calculated under all illumination conditions ("YES" in step 110), the process advances to step 111. If measurement has not finished under all illumination conditions ("NO" in step 110), j is set to 0, k is incremented by one, and the process returns to step 108.

In step 111, it is determined whether shot arrangements are calculated in all shot sets. If shot arrangements are calculated under all shot sets ("YES" in step 111), the process advances to step 112. If shot arrangements are not calculated in all shot sets ("NO" in step 111), i and k are set to 0, 1 is incremented by one, and the process returns to step 108.

Figure 8:
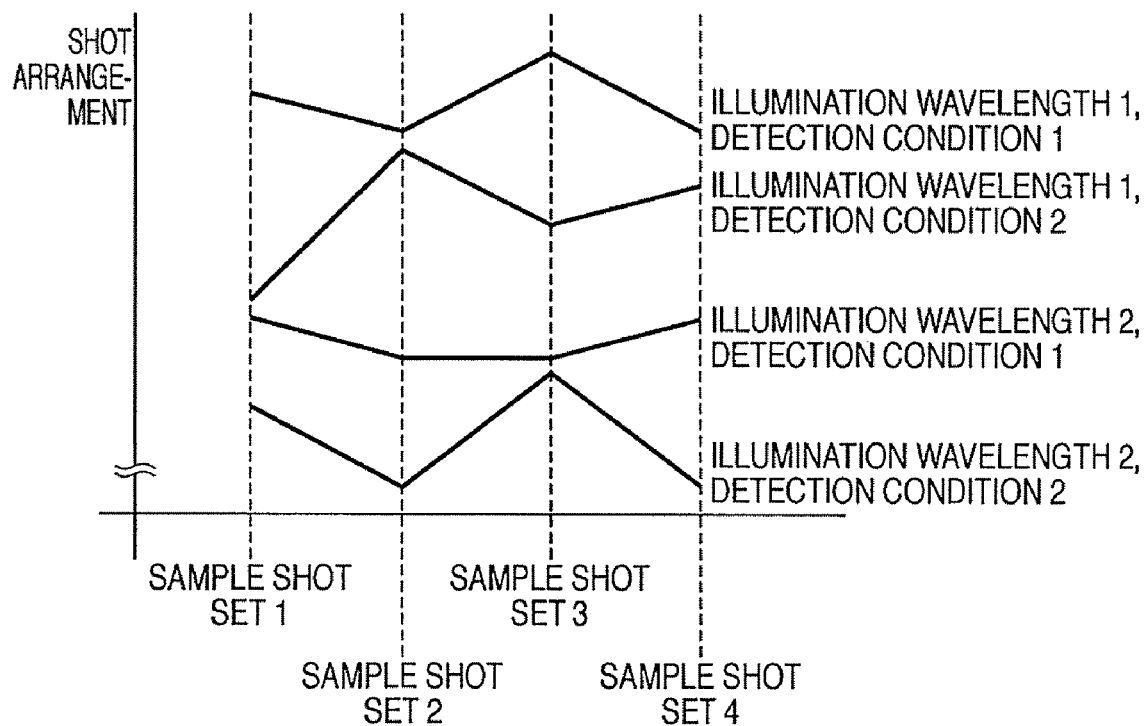
FIG. 8 is a graph showing an example of a shot arrangement variation between the sample shot sets.

FIG. 8 is a graph whose abscissa represents a sample shot set that has undergone arrangement shape calculation and whose ordinate represents a shot arrangement including a magnification and orthogonality.

In step 112, a measurement condition (the combination of illumination condition 2 and detection condition 1 in FIG. 8) corresponding to the most stable shot arrangement calculation result between all sample shot sets is selected. The determination unit 15 determines the selected measurement condition as the measurement condition for the exposure process.

Second Embodiment

Figure 3B:
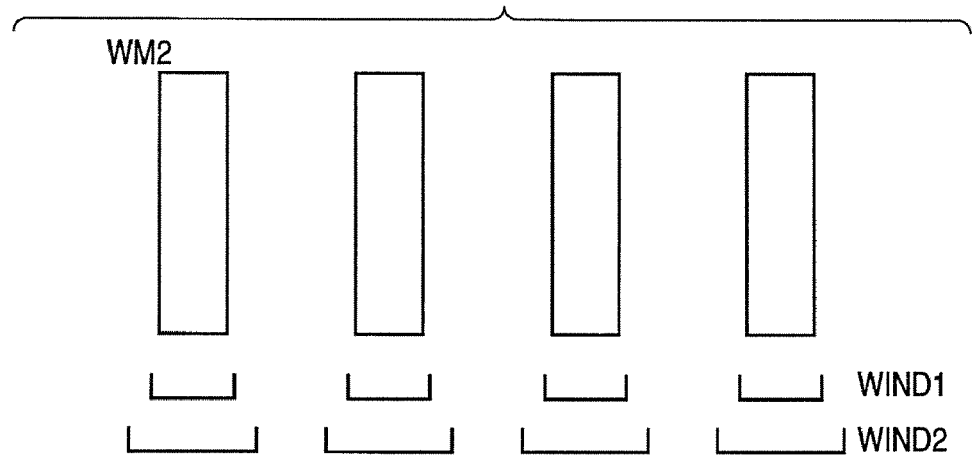
Figure 3C:
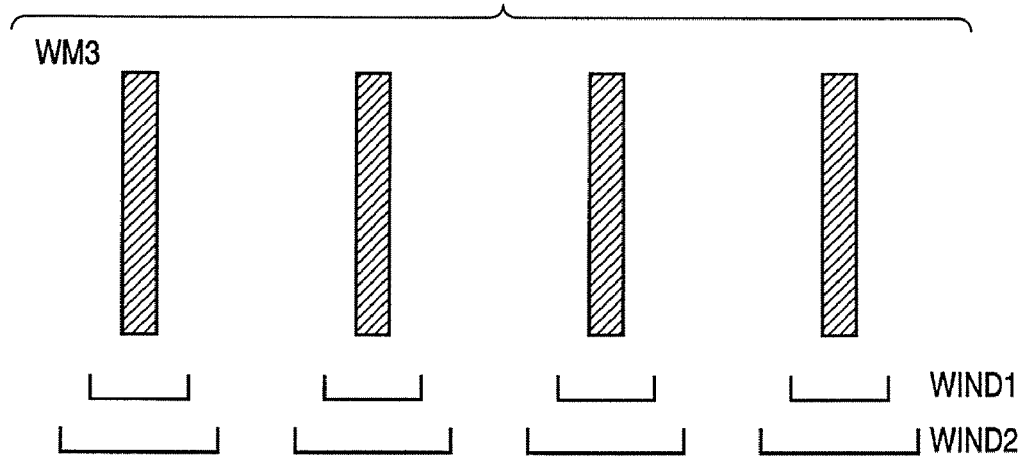
Figure 4:
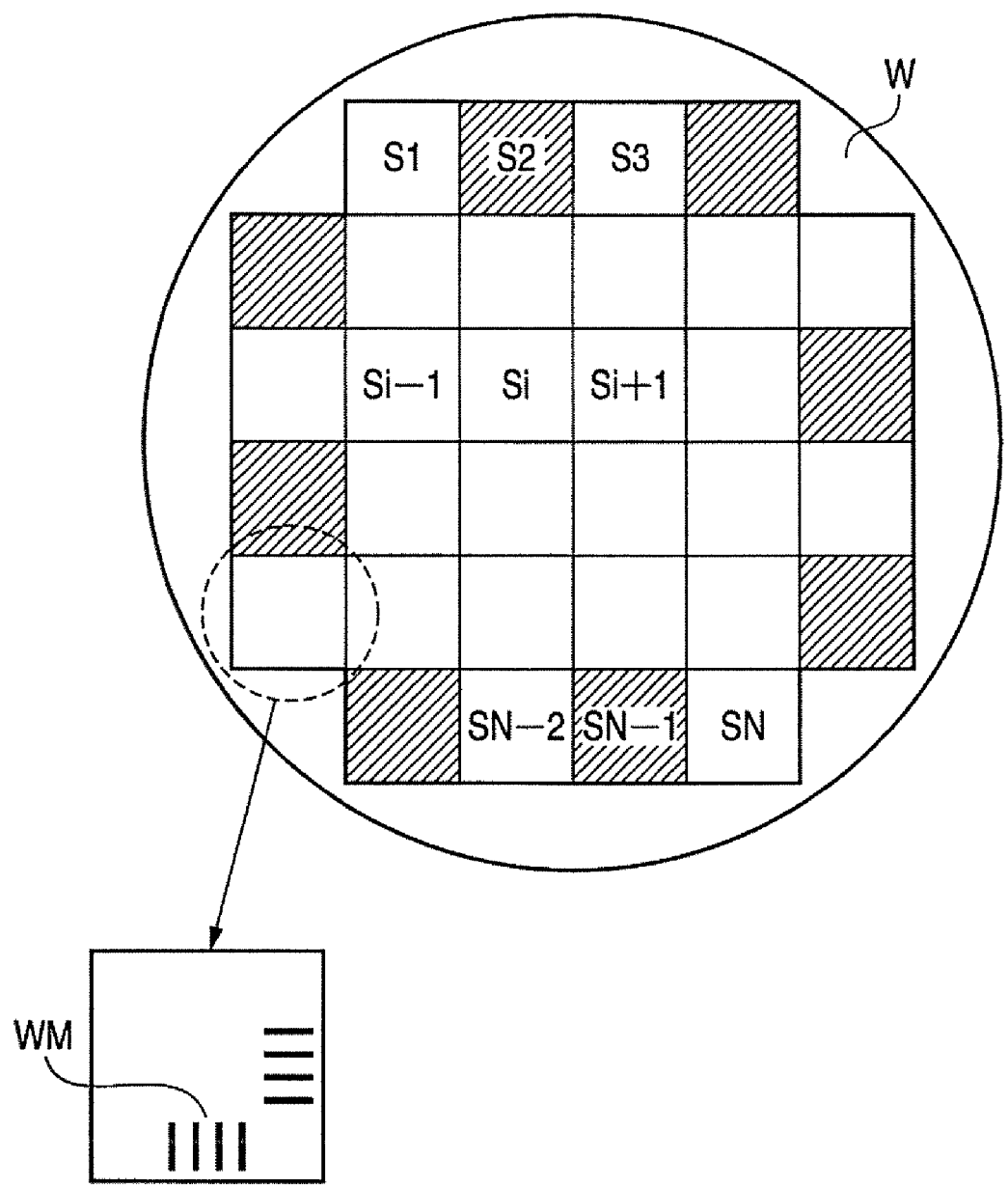
FIG. 4 is a view showing an example of a sample shot set.
Figure 9A:
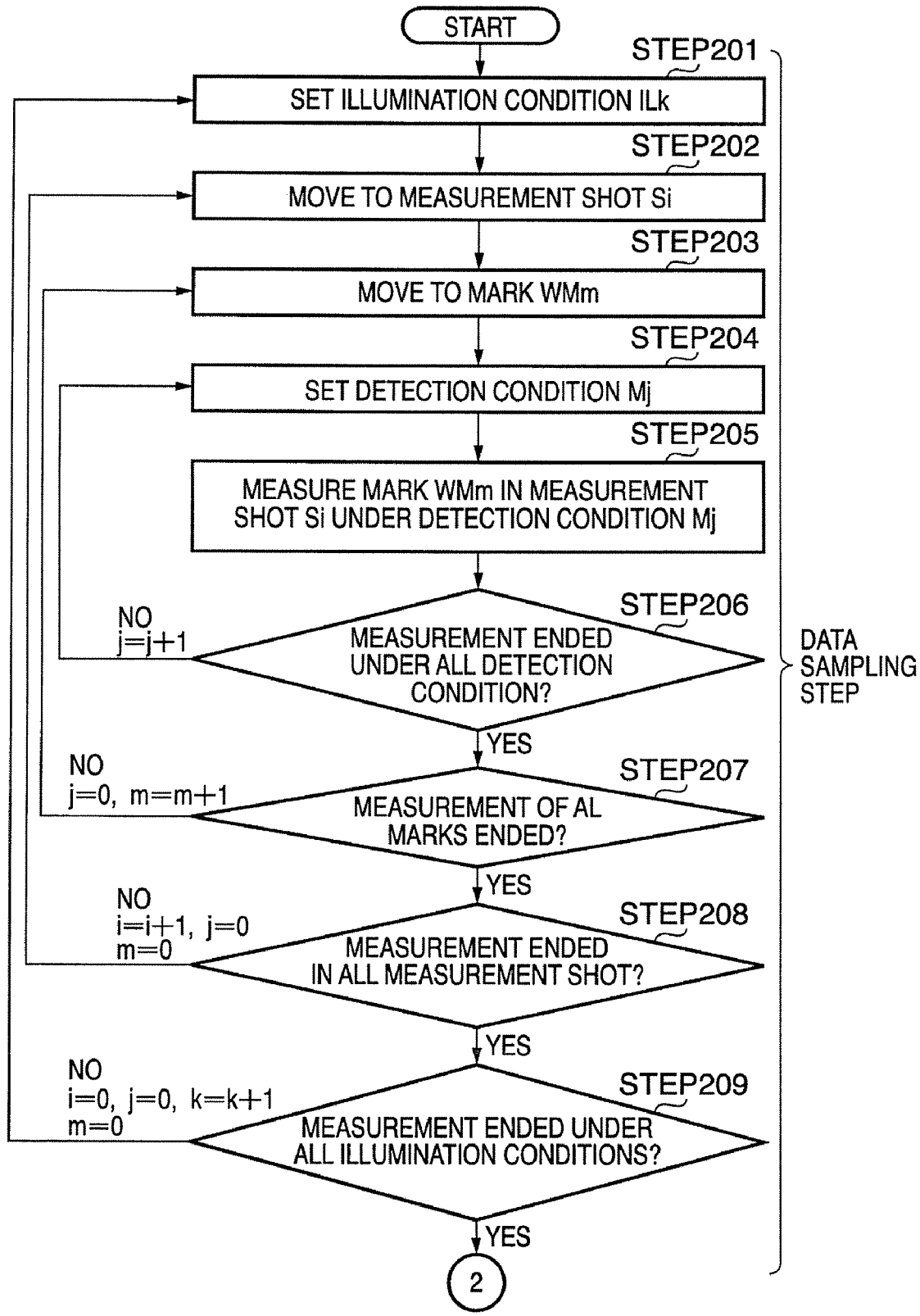
FIGS. 9A and 9B are flowcharts illustrating an example of a flow of measurement condition selection according to the second embodiment.
Figure 9B:
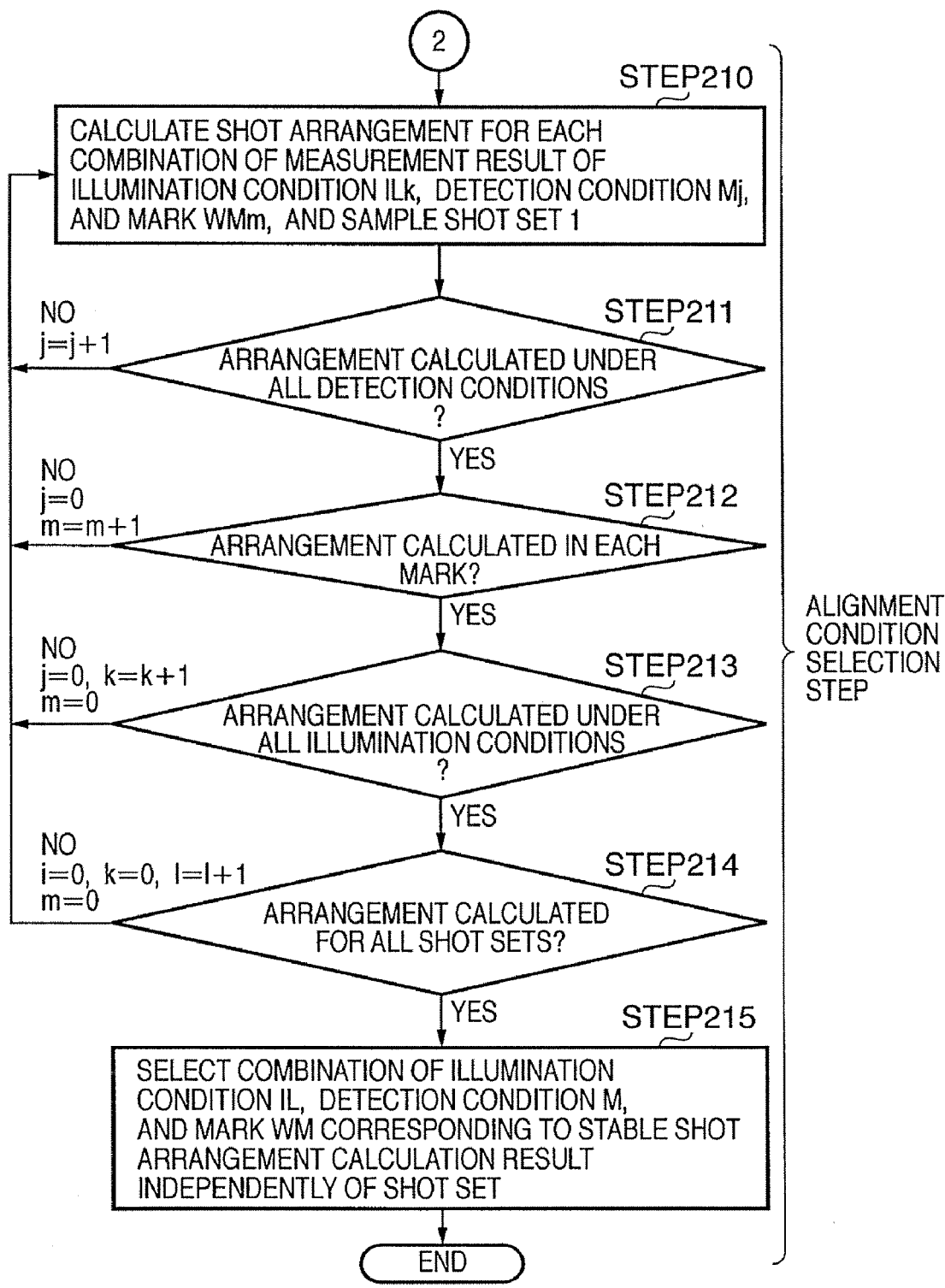

In the first embodiment, each shot area Si on the substrate W has only one kind of mark. In the second embodiment, each shot area Si has a plurality of kinds of marks with different pitches or line widths, as shown in FIGS. 3A to 3C. A method of determining a mark and a measurement condition optimum for calculating a shot arrangement on a substrate according to the second embodiment will be described. FIGS. 9A and 9B are flowcharts for explaining the flow of measurement condition determination according to the second embodiment.

In step 201, an illumination condition switching unit 4 selects a first illumination condition IL1. In steps 202 and 203, the stage moves to a position where it is possible to observe a first mark WM1 in a first shot S1 on the substrate. In step 204, a detection condition switching unit 12 selects a first detection condition M1.

In step 205, an illumination unit 3 is turned on to illuminate the mark WM1 through a beam splitter 7, reticle R, and projection optical system 1. A light beam reflected by the mark area forms the image of the mark WM1 on the imaging plane of an image sensing unit 8. The image sensing unit 8 photoelectrically converts the image of the mark WM1. An A/D converter 9 converts the mark image into a two-dimensional digital signal sequence. A measuring device measures the central position of the mark WM1 by using the converted digital signal sequence.

The detection condition switching unit 12 selects a second detection condition M2, and step 205 is repeated. When the mark WM1 in the first shot S1 is measured under all detection conditions ("YES" in step 206), the process moves to a mark WM2 in the first shot S1, and steps 204 to 206 are repeated. When the marks in the first shot S1 are measured under all detection conditions ("YES" in step 207), the process moves to a second shot S2, and steps 203 to 207 are repeated. When measurement of all shots has finished in accordance with the same procedure ("YES" in step 208), the illumination condition switching unit 4 sets a second illumination condition IL2, and steps 202 to 208 are repeated. After the data sampling step is ended under all combinations of illumination conditions and detection conditions in accordance with the above-described procedure, the process advances to step 209 to start shot arrangement calculation based on all combinations of conditions.

More specifically, in steps 210 to 214, shot arrangements are calculated based on all combinations of illumination conditions ILk and detection conditions Mj sampled in the data sampling step, marks WMm, and the sample shot sets shown in FIG. 7. In step 215, a combination of the illumination condition ILk, detection condition Mj, and mark WMm corresponding to the most stable shot arrangement between all sample shot sets is determined as a measurement condition, as in the first embodiment.

It is unnecessary to determine the optimum measurement condition for each measurement target substrate. For example, selection and storage of the optimum measurement condition are done for the first substrate of a lot, and the condition determined for the first substrate is used for alignment of the remaining substrates. In manufacturing substrates in the same process, it is possible to shorten the time required for optimization by using the stored optimum measurement condition.

In the data sampling step of the first and second embodiments, all shots are measured based on combinations of all illumination conditions and all detection conditions. However, it is unnecessary to sample data in all combinations. It is also possible to shorten the time required for optimum measurement condition determination by narrowing down the measurement shots and illumination conditions in advance.

In the first and second embodiments, data are sampled while changing the illumination light wavelength and NA. Any other condition such as the light source itself may be changed.

Third Embodiment

Figure 10:
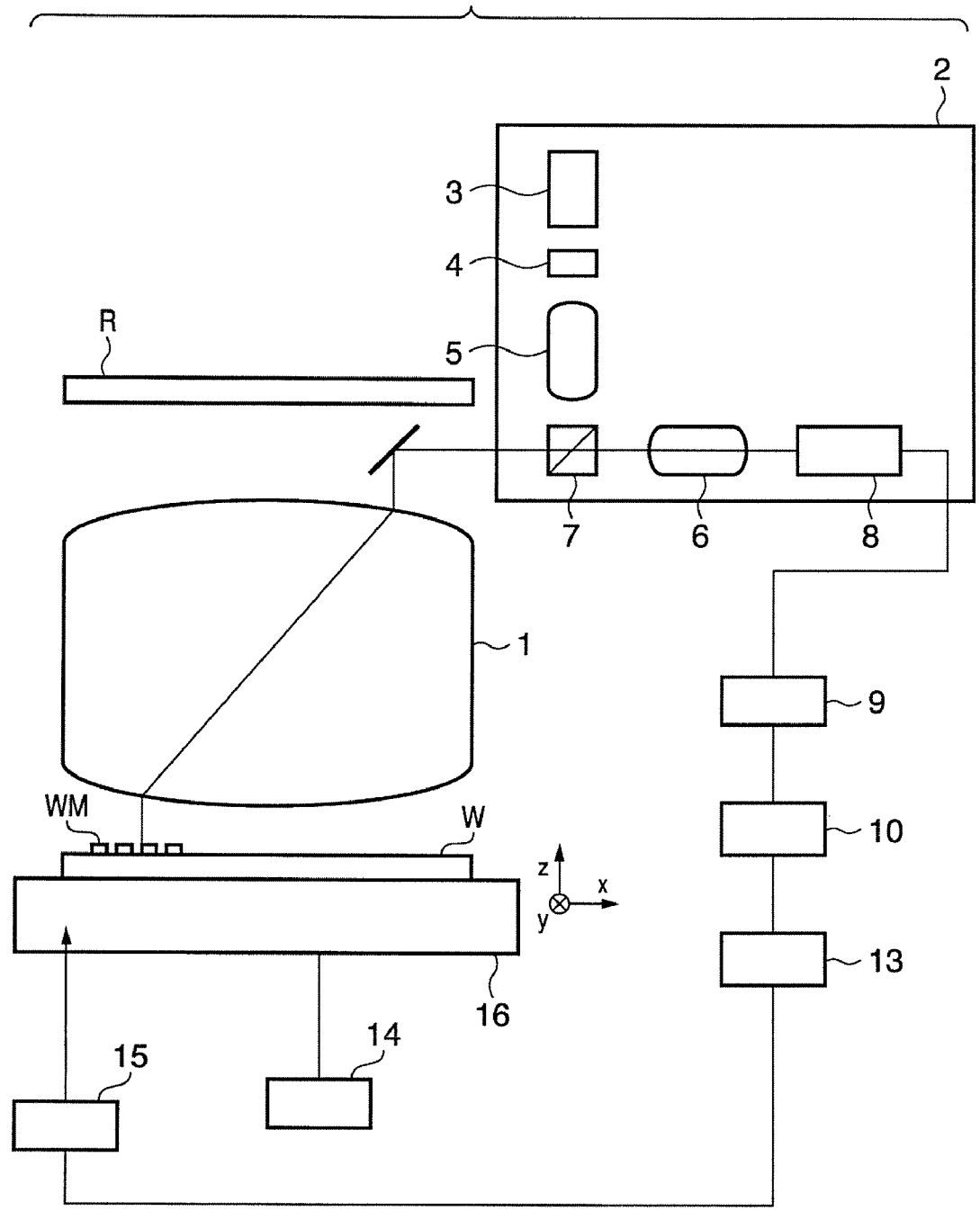
FIG. 10 is a view showing an arrangement example of an exposure apparatus according to the third embodiment.

In the first and second embodiments, the semiconductor manufacturing exposure apparatus has an alignment optical axis passing through the reticle and projection optical system. The third embodiment will be described, which applies the technique of the present invention to an exposure apparatus having a through-the-lens (TTL) alignment optical system whose alignment optical axis does not pass through a reticle R. For example, it is possible to sense a mark WM on the stage without intervening the reticle R, as shown in FIG. 10. The optimum measurement condition determination procedure is the same as in the first or second embodiment.

Fourth Embodiment

Figure 11:
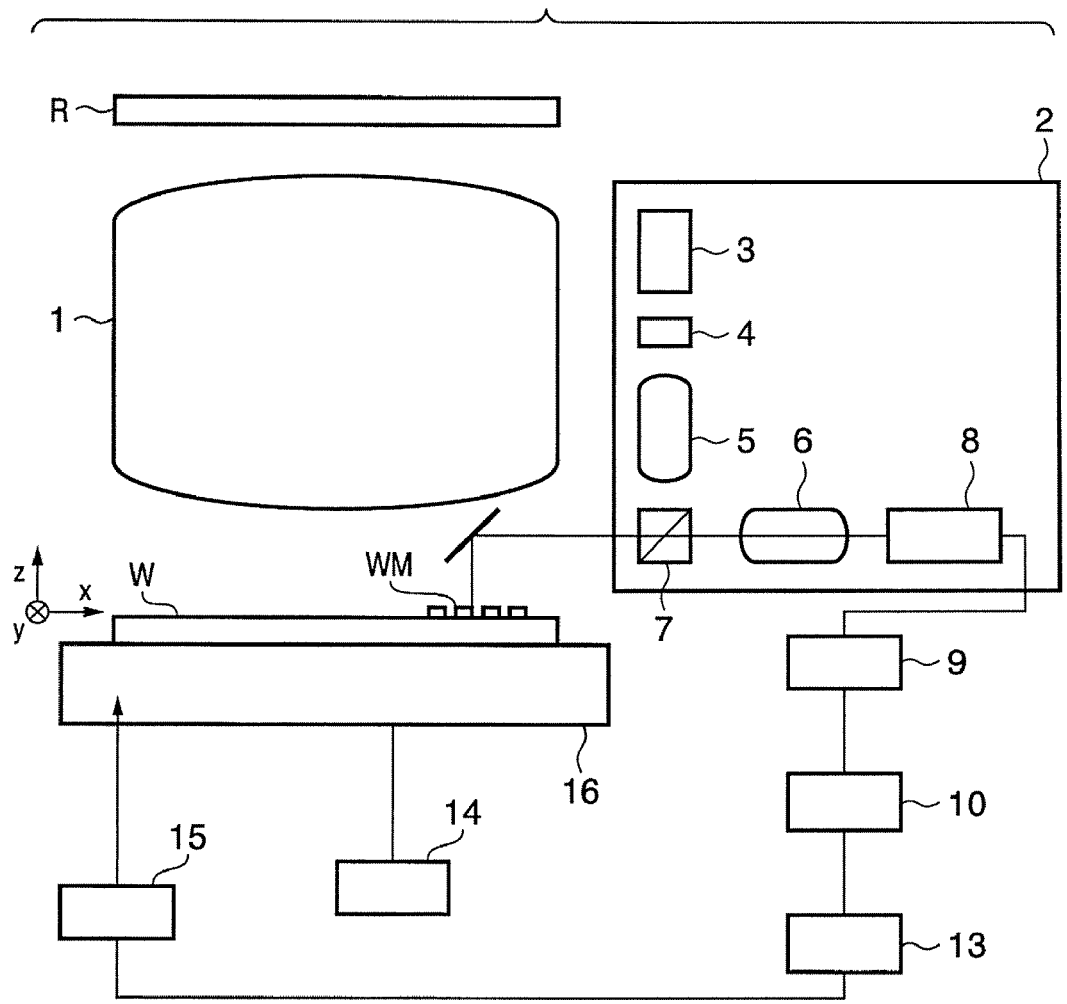
FIG. 11 is a view showing an arrangement example of an exposure apparatus according to the fourth embodiment.

The fourth embodiment will be described, which applies the technique of the present invention to an exposure apparatus having an off-axis alignment optical system whose alignment optical axis does not pass through a reticle and a projection optical system. For example, it is possible to directly sense a mark WM on the stage without intervening a reticle R or projection optical system 1, as shown in FIG. 11. The optimum measurement condition determination procedure is the same as in the first or second embodiment.

Modification

In the above embodiments, the variation (standard deviation) in the shot arrangement calculated for each of the plurality of sample shot sets in association with each of the plurality of measurement conditions is calculated, and the control unit 10 automatically determines the measurement condition based on the variation calculated for each of the plurality of measurement conditions. However, the control unit 10 may cause the display unit to display the information of the variation calculated for each of the plurality of measurement conditions. The user of the exposure apparatus can set the measurement condition based on the displayed information. The display unit may be included in, for example, a console 100 connected to the control unit 10 of the exposure apparatus 1.

Embodiment of Device Manufacturing Method

An embodiment of a device manufacturing method using the above exposure apparatus will be described with reference to FIGS. 13 and 14.

Figure 13:
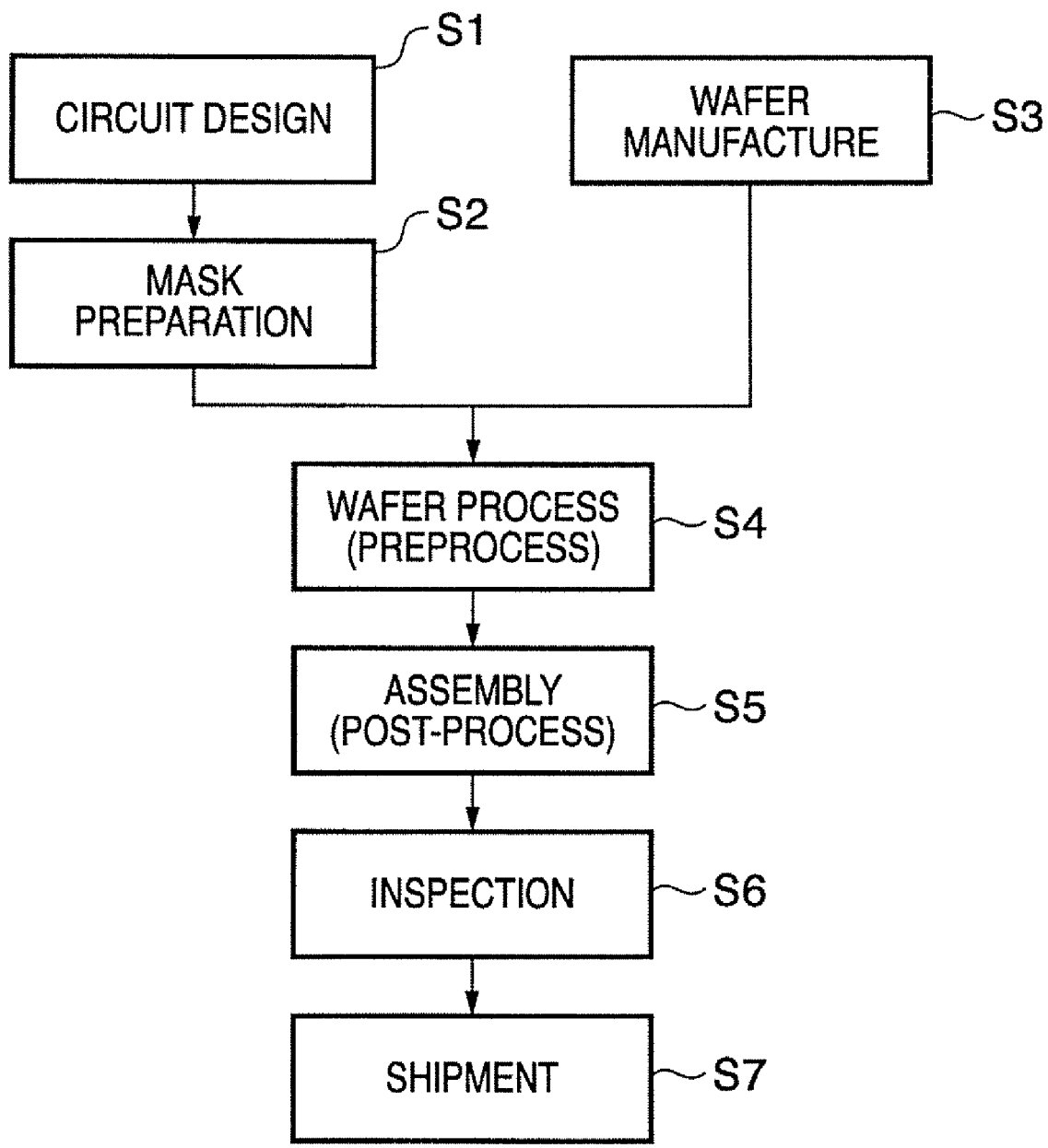
FIG. 13 is a flowchart for explaining device manufacturing using an exposure apparatus.

FIG. 13 is a flowchart for explaining the manufacture of a device (e.g., a semiconductor chip such as an IC or LSI, LCD, or CCD). A semiconductor chip manufacturing method will be exemplified here.

In step S1 (circuit design), the circuit of a semiconductor device is designed. In step S2 (mask preparation), a mask is prepared based on the designed circuit pattern. In step S3 (wafer manufacture), a substrate is manufactured using a material such as silicon. In step S4 (wafer process) called a preprocess, the above-described exposure apparatus forms an actual circuit on the substrate by lithography using the mask and substrate. In step S5 (assembly), a semiconductor chip is formed from the substrate prepared in step S4. This step includes processes such as assembly (dicing and bonding) and packaging (chip encapsulation). In step S6 (inspection), inspections including operation check test and durability test of the semiconductor device manufactured in step S5 are performed. A semiconductor device is completed with these processes and shipped (step S7).

Figure 14:
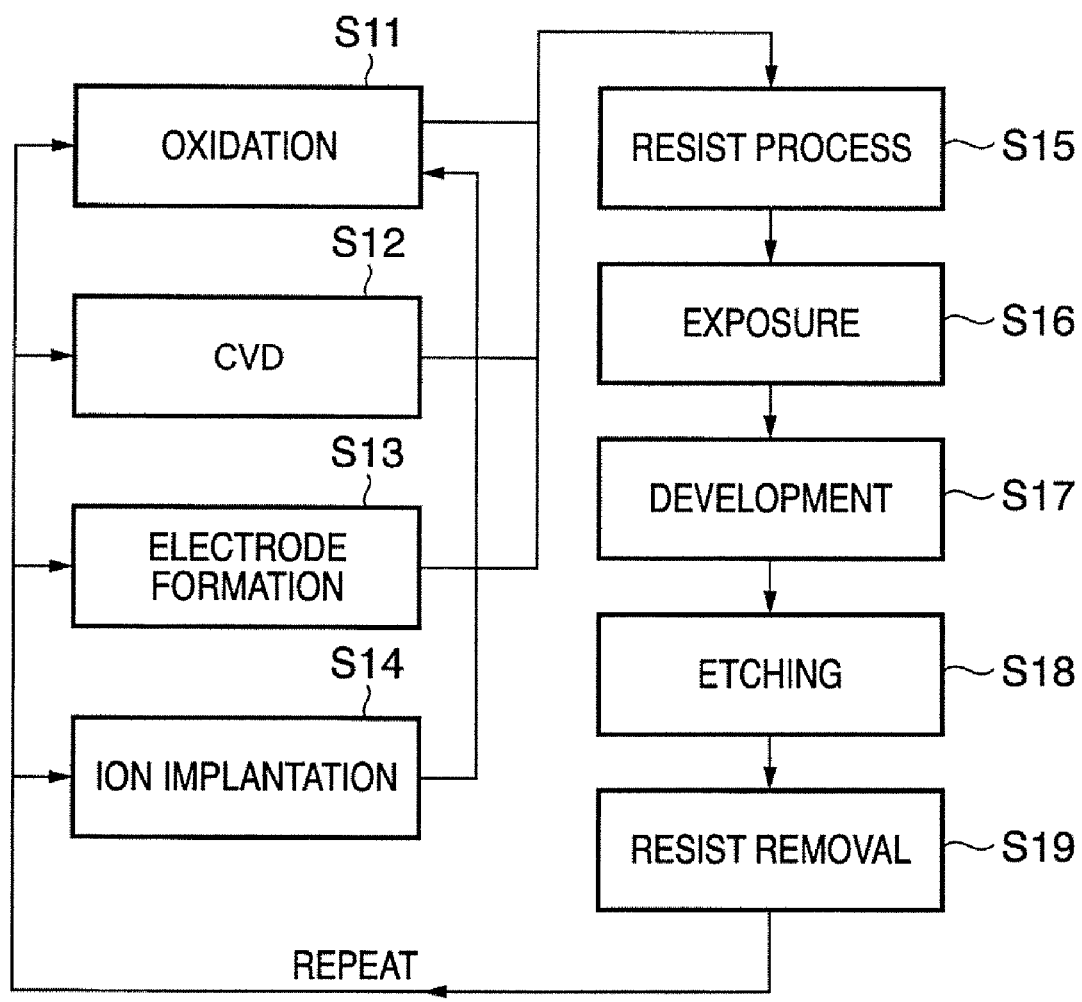
FIG. 14 is a flowchart illustrating details of a wafer process in step S4 of the flowchart shown in FIG. 13.

FIG. 14 is a flowchart illustrating details of the wafer process in step S4. In step S11 (oxidation), the surface of the substrate is oxidized. In step S12 (CVD), an insulating film is formed on the substrate surface. In step S13 (electrode formation), an electrode is formed on the substrate by deposition. In step S14 (ion implantation), ions are implanted into the substrate. In step S15 (resist process), a photosensitizer is applied to the substrate. In step S16 (exposure), the exposure apparatus exposes the circuit pattern of the mask to the substrate. In step S17 (development), the exposed substrate is developed. In step S18 (etching), portions other than the developed resist image are etched. In step S19 (resist removal), any unnecessary resist remaining after etching is removed. By repeating these steps, multilayered circuit patterns are formed on the substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-328841, filed Dec. 5, 2006, which is hereby incorporated by reference herein in its entirety.

What is claimed is:

1. An exposure apparatus for exposing each of a plurality of shot areas on a substrate to radiant energy, the apparatus comprising:
   a measuring device configured to measure a position of an alignment mark formed for a shot area on the substrate; and
   a controller configured to generate a plurality of sample shot sets from the plurality of shot areas on the substrate, to cause the measuring device to measure the position of each alignment mark in each of the plurality of sample shot sets under each of a plurality of measurement conditions, to calculate a shot arrangement based on the measured positions with respect to each of combinations of the plurality of measurement conditions and the plurality of sample shot sets, to calculate a variation of the shot arrangements calculated with respect to the plurality of sample shot sets with respect to each of the plurality of measurement conditions, and to display the variation calculated with respect to each of the plurality of measurement conditions.

2. An apparatus according to claim 1, wherein the controller is configured to determine a measurement condition for measuring the position of the alignment mark based on the variation calculated with respect to each of the plurality of measurement conditions.

3. An apparatus according to claim 1, wherein the plurality of measurement conditions are different from each other in at least one of a condition of an optical system included in the measuring device, an algorithm used by the measuring device, and a shape of the alignment mark.

4. An apparatus according to claim 1, wherein the controller is configured to determine the measurement condition using the first substrate in a lot of substrates and to use the determined condition for the next substrate in the lot of substrates.

5. A method of manufacturing a device, said method comprising:
   exposing a substrate to radiant energy using an exposure apparatus;
   developing the exposed substrate; and
   processing the developed substrate to manufacture the device, the exposure apparatus including:
   a measuring device configured to measure a position of an alignment mark formed for a shot area on the substrate; and
   a controller configured to generate a plurality of sample shot sets from the plurality of shot areas on the substrate, to cause the measuring device to measure the position of each alignment mark in each of the plurality of sample shot sets under each of a plurality of measurement conditions, to calculate a shot arrangement based on the measured positions with respect to each of combinations of the plurality of measurement conditions and the plurality of sample shot sets, to calculate a variation of the shot arrangements calculated with respect to the plurality of sample shot sets with respect to each of the plurality of measurement conditions, and to display the variation calculated with respect to each of the plurality of measurement conditions.

* * * * *